US005859211A

United States Patent [19]

Kreuder et al.

[11] Patent Number: 5,859,211

[45] Date of Patent: Jan. 12, 1999

[54] CONJUGATED POLYMERS CONTAINING HETEROSPIRO ATOMS AND THEIR USE AS ELECTROLUMINESCENCE MATERIALS

[75] Inventors: Willi Kreuder, Mainz; Donald Lupo, Frankfurt; Josef Salbeck, Kelkheim; Hermann Schenk, Hofheim; Thomas Stehlin, Kriftel, all of Germany

[73] Assignee: Hoechst Aktiengesellschaft, Frankfurt, Germany

[21] Appl. No.: 840,843

[22] Filed: Apr. 17, 1997

[30] Foreign Application Priority Data

Apr. 17, 1996 [DE] Germany ........................ 196 15 128.7

[51] Int. Cl.$^6$ ........................ C08G 59/00

[52] U.S. Cl. .......................... 528/403; 528/405; 528/406; 528/407; 528/418; 528/419

[58] Field of Search .................................... 528/403, 405, 528/406, 407, 418, 419

[56] References Cited

U.S. PATENT DOCUMENTS

| | | | |
|---|---|---|---|
| 5,026,894 | 6/1991 | Tour et al. | 558/46 |
| 5,621,131 | 4/1997 | Kreuder et al. | 558/46 |

FOREIGN PATENT DOCUMENTS

| | | |
|---|---|---|
| 0 443 861 | 8/1991 | European Pat. Off. . |
| 0707020 | 4/1996 | European Pat. Off. . |
| 259 229 | 5/1991 | France . |
| WO 90/13148 | 11/1990 | WIPO . |
| WO 96/17036 | 6/1996 | WIPO . |

OTHER PUBLICATIONS

J.M. Tour et al., J. Am. Chem. Soc., vol. 112, 1990, p. 5662 ff.

J.M. Tour et al., J. Am. Chem. Soc., vol. 113, 1991, p. 7064 ff.

J.M. Tour et al., J. Am. Chem. Soc., 1990, p. 408.

Journal of the Chemical Society, Faraday Transactions, Bd. 9, Nr. 2, Jan. 21, 1994, pp. 321–325.

*Primary Examiner*—Edward J. Cain

*Attorney, Agent, or Firm*—Frommer Lawrence & Haug LLP

[57] ABSTRACT

A conjugated polymer comprising repeating units of the formula (I),

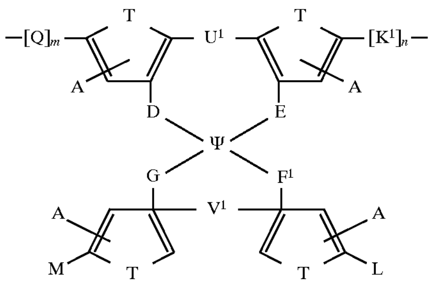

(I)

where the symbols and indices have the following meanings:

Ψ is an element of the 4th main group of the Periodic Table with the exception of carbon;

D, E, F, G are identical or different and are $—CR^1R^2—$, —O—, —S—, $—NR^3—$ or a chemical bond;

U is $—CR^4{=}CR^5—$ or a chemical bond;

V is as defined for U or is $—CR^1R^2—$, —O—, —S—, $—NR^3—$, $—SiR^1R^2—$, $—SO_2—$, —O—, —CO—;

A are identical or different and are H, a $C_1—C_{20}$-hydrocarbon radical which can also contain heteroatoms;

T is —O—, —S—, $—NR^3—$, $—CR^1R^2—$, —CH=N—, —CA=CA—, —CH=CA—, —CH=CF— or —CF=CF—;

K, Q are identical or different hydrocarbon radicals which can contain heteroatoms and have conjugated electron systems;

M, L are H or a straight-chain or branched alkyl group having from 1 to 22 carbon atoms, Br, Cl, F, CN, $NO_2$ or $CF_3$;

m, n are identical or different and are 0, 1, 2, 3 or 4; and wherein said polymer is suitable as an electroluminescence material.

20 Claims, No Drawings

CONJUGATED POLYMERS CONTAINING HETEROSPIRO ATOMS AND THEIR USE AS ELECTROLUMINESCENCE MATERIALS

RELATED APPLICATION

This application claims priority to German Application No. 19 615 128.7, filed Apr. 17, 1996, incorporated herein by reference.

BACKGROUND OF THE INVENTION

1. Field of the Invention

This invention relates to the use of conjugated polymers in electroluminescence materials, wherein the conjugated polymers comprise at least one repeating unit based on a heterospiro framework. Such compounds surprisingly have excellent thermal stability, improved solubility in organic solvents, improved film-forming properties and particularly good electroluminescence with high color purity.

2. Description of the Related Art

Several publications are referenced in this application. These references describe the state of the art to which this invention pertains, and are incorporated herein by reference.

There is a great industrial need for large-area solid-state light sources for a series of applications, predominantly in the field of display elements, VDU technology and lighting engineering. What is required of these light sources cannot at present be achieved fully satisfactorily using any of the existing technologies.

As an alternative to conventional display and lighting elements such as incandescent lamps, gas discharge lamps and non-selfilluminating liquid crystal display elements, use has been made for some time of electroluminescence (EL) materials and devices such as light-emitting diodes (LEDs).

Apart from inorganic electroluminescence materials, low molecular weight organic electroluminescence materials and devices have also been known for about 30 years (see, for example, U.S. Pat. No. 3,172,862). However, until recently, such devices have been greatly restricted in their practical usability.

WO 90/13148 and EP-A 0 443 861 describe electroluminescence devices comprising a film of a conjugated polymer as a light-emitting layer (semiconductor layer). Such devices offer numerous advantages such as the opportunity of producing large-area, flexible displays simply and inexpensively. In contrast to liquid crystal displays, electroluminescence displays are selfilluminating and therefore require no additional backward lighting source.

A typical device as described in WO 90/13148 comprises a light-emitting layer in the form of a thin, dense polymer film (semiconductor layer), which comprises at least one conjugated polymer. A first contact layer is in contact with a first surface, a second contact layer is in contact with a further surface of the semiconductor layer. The polymer film of the semiconductor layer has a sufficiently low concentration of extrinsic charge carriers for charge carriers to be introduced into the semiconductor layer on application of an electric field between the two contact layers, with one contact layer becoming positive relative to the other and the semiconductor layer emitting radiation. The polymers used in such devices are conjugated. A conjugated polymer is a polymer having a delocalized electron system along the main chain. The delocalized electron system gives the polymer semiconducting properties and enables it to transport positive and/or negative charge carriers with high mobility.

In WO 90/13148, poly(p-phenylenevinylene) is used as polymeric material for the light-emitting layer and it is proposed that the phenyl group in such a material be replaced by a heterocyclic or a condensed carbocyclic ring system. In addition, poly(p-phenylene), PPP, is also used as electroluminescent material.

Although these materials give good results, the color purity, is unsatisfactory. Furthermore, it is virtually impossible to produce a blue or white emission using the polymers known hitherto.

Since, in addition, the development of electroluminescence materials, in particular those based on polymers, can in no way be regarded as concluded, the manufacturers of lighting and display devices are interested in a great variety of electroluminescence materials for such devices. This is, inter alia, also because only through study of the interaction of the electroluminescence materials with the other components of the devices can conclusions be drawn in respect to the quality of the electroluminescence material.

SUMMARY OF THE INVENTION

The invention relates to novel conjugated polymers comprising at least one repeating unit based on a heterospiro framework and to methods of using the same as electroluminescent materials. Surprisingly, it has now been found that conjugated polymers comprising at least one repeating unit based on a heterospiro framework not only have excellent thermal stability, improved solubility in organic solvents and improved film-forming properties but also, in particular, good electroluminescence and photoluminescence having a high color purity.

Spiro compounds are compounds in which two ring systems are linked by a single, tetravalent atom. This atom is referred to as a spiro atom, as explained in Handbook of Chemistry and Physics 62$^{nd}$ ed. (1981–2), CRC Press, pages C-23 to C-25.

Compounds in which two polymers are linked via a single spiro center have been proposed, for example, in U.S. Pat. No. 5,026,894 and in J. M. Tour et al., J. Am. Chem. Soc. 1990, 112, 5662; J. M. Tour et al., J. Am. Chem. Soc. 1991, 113, 7064 and J. M. Tour et al., Polym. Prepr. 1990, 408, as materials, however, for molecular electronics. A possible suitability of such compounds as electroluminescence materials cannot be deduced therefrom.

The invention accordingly provides conjugated polymers comprising repeating units of the formula (I),

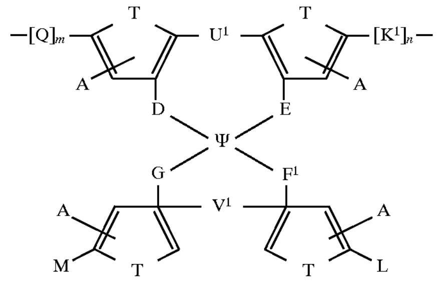
(I)

where the symbols and indices have the following meanings:

Ψ is an element selected from the group consisting of Si, Ge, Sn and Pb, preferably Sn, Ge, Si, most preferably Ge or Si;

D, E, $F^1$, G are identical or different, and are —$CR^1R^2$—, —O—, —S—, —$NR^3$— or a chemical bond; where $R^1$, $R^2$, $R^3$ are identical or different, and are each a $C_1$–$C_{20}$- hydrocarbon radical or H or $R^1$ and $R^2$ can together form an unsubstituted or substituted ring;

$U^1$ is —$CR^4$═$CR^5$— or a chemical bond; where $R^4$, $R^5$ are identical or different, and are as defined for $R^1$, $R^2$, $R^3$ or are fluorine or $CF_3$;

$V^1$ is as defined for $U^1$ or is —$CR^1R^2$—, —O—, —S—, —$NR^3$—, —$SiR^1R^2$—, —$SO_2$—, —SO—, —CO— where $R^1$, $R^2$, $R^3$ are as defined above;

A is identical or different and is H, a $C_1$–$C_{20}$-, preferably $C_1$–$C_{15}$-hydrocarbon radical which can also contain heteroatoms, preferably —O—, —N or fluorine, most preferably a linear, branched or cyclic alkyl, alkoxy or alkyloxycarbonyl group, —$CF_3$, —CN, —$NO_2$, —$NR^6R^7$, —$A^2$, or —O—$A^2$;

$R^6$ and $R^7$ are identical or different and are H, a $C_1$–$C_{20}$-hydrocarbon radical which can be aliphatic, aromatic, linear, branched or alicyclic, wherein $R^6$ and $R^7$ can, if desired, together form a ring; $R^6$ and $R^7$ are preferably methyl, ethyl, t-butyl, cyclohexyl, 3-methylphenyl or together

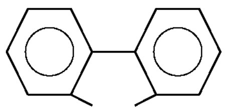;

$A^2$ is an aromatic radical having up to 22 carbon atoms, preferably phenyl, biphenyl, 1-naphthyl, 2-naphthyl, 2-thienyl, 2-furanyl, wherein $A^2$ can bear one or two radicals as defined for A;

T is —O—, —S—, —$NR^3$—, —$CR^1R^2$—, —CH═N—, —CA═CA—, —CH═CA—, —CH═CF— or —CF═CF—, where $R^1$, $R^2$, $R^3$ and A are as defined above; T is preferably —CH═CH—;

$K^1$, Q are identical or different, hydrocarbon radicals which may contain heteroatoms and have conjugated electron systems; where $K^1$, L, M, and Q can also be joined to the groups A in the respective ortho positions to form a ring which is saturated, partially unsaturated or fully unsaturated, with a fused aromatic ring system preferably being present;

M, L are H or Br, Cl, F, CN, $NO_2$ or $CF_3$, or a straight-chain or branched alkyl group having from 1 to 22 carbon atoms, where one or more, preferably one, —$CH_2$— groups can be replaced by —O—, —CO—O—, —O—CO— and one or more hydrogen atoms of the $C_1$–$C_{22}$-alkyl group can be replaced by F;

m, n are identical or different, and are 0, 1, 2, 3 or 4, with the following polymers being excepted:

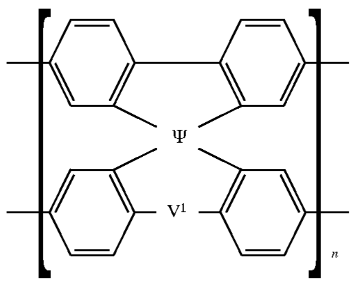

wherein:

Ψ═Si $V^1$═CO and

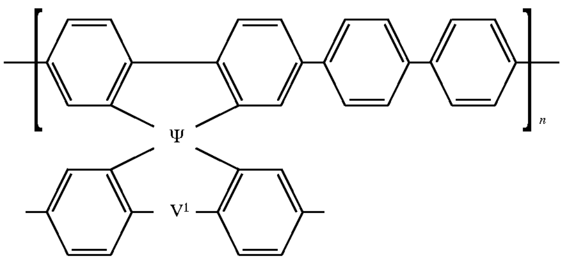

wherein:

Ψ═Si $V^1$═CO.

DETAILED DESCRIPTION OF THE INVENTION

Preference is given to conjugated polymers comprising repeating units of the formula (II),

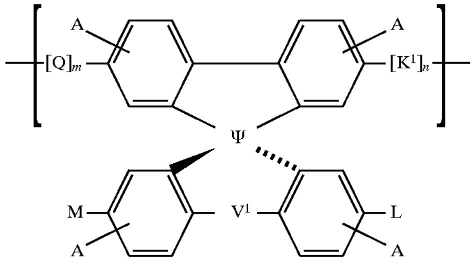

(II)

where the symbols and indices have the following meanings:

Ψ is Sn, Ge or Si;

Q, $K^1$, M are identical or different, and are each one to fifteen identical or different arylene and/or heteroarylene and/or vinylene groups which may be substituted or unsubstituted;

A are identical or different and can be as defined in the formula (I);

M, L are H, Br, Cl, F, CN, $NO_2$ or $CF_3$, or a straight-chain or branched alkyl group having from 1 to 22 carbon atoms, where one or more, preferably one, —$CH_2$— groups can be replaced by —O—, —CO—O—, —O—CO—and one or more hydrogen atoms of the $C_1$—$C_{22}$-alkyl group can be replaced by F;

m, n are identical or different, and are 0 or 1, with the following polymers being excepted:

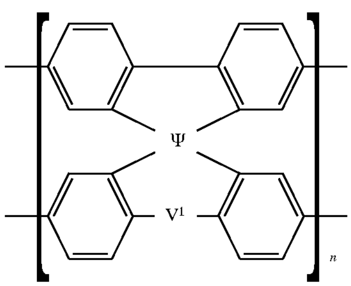

wherein:

Ψ═Si $V^1$=CO and

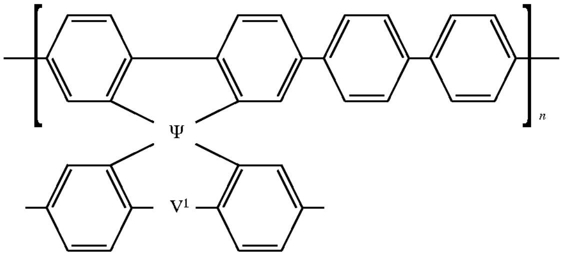

wherein:

Ψ=Si $V^1$=Co.

The polymers of the invention having the formulae (I) and (II) have, in particular, a high color purity of the emission.

For the purposes of the invention, a polymer is a compound whose electroluminescence spectrum remains essentially unchanged on addition of further repeating units.

The polymers of the invention having the formulae (I) and (II) generally have from 2 to 1000, preferably from 2 to 500, most preferably from 2 to 100, repeating units.

Further preference is given to those polymers of the formula (II) in which the symbols and the indices have the following meanings:

A are identical or different and are $R^1$, $R^2$, $R^3$ and/or $R^4$;

Q, $K^1$ are identical or different, conjugated $C_2$–$C_{100}$-hydrocarbon radicals, in particular

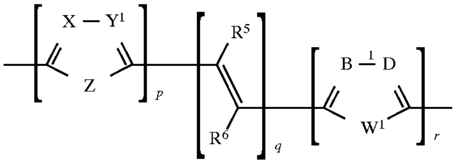

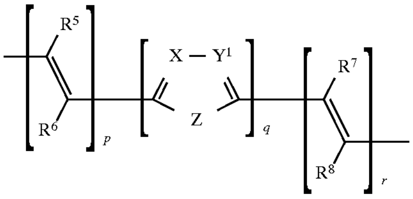

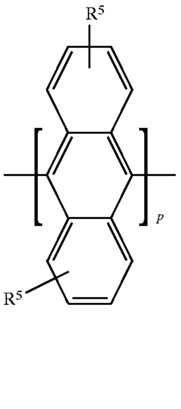

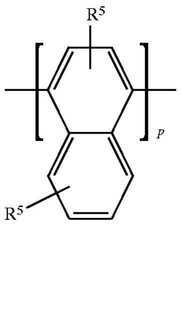

-continued

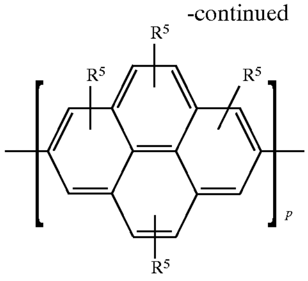

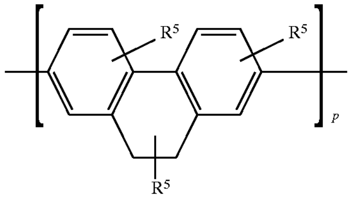

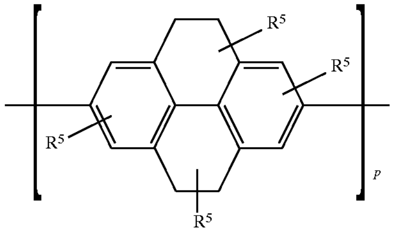

X, $Y^1$, $B^1$, D are identical or different, and are $CR^5$, or N;

Z, $W^1$ are identical or different and are —O—, —S—, —$NR^5$—, —$CR^5R^6$—, —$CR^5$50 $CR^6$—, —$CR^5$50 N—;

p, q, r are, independently of one another, identical or different and are 0, or 1 to 5;

$R^1$, $R^2$, $R^3$, $R^4$, $R^5$, $R^6$, $R^7$, $R^8$ are identical or different and are H, a straight-chain or branched alkyl, alkoxy or ester group having from 1 to 22 carbon atoms, aryl and/or aryloxy groups, preferably phenyl and/or phenyloxy groups, where the aromatic can be substituted by $C_1$–$C_{22}$-alkyl, $C_1$–$C_{22}$-alkoxy, Br, Cl, F, CN, and/or $NO_2$, Br, Cl, F, CN, $NO_2$, $CF_3$;

M, L are H, Br, Cl, F, CN, $NO_2$, $CF_3$, or a straight-chain or branched alkyl group having from 1 to 22 carbon atoms, where one or more, preferably one, —$CH_2$— groups can be replaced by —O—, —CO—O—, —O—CO— and one or more hydrogen atoms can be replaced by F;

with the following polymers being excepted:

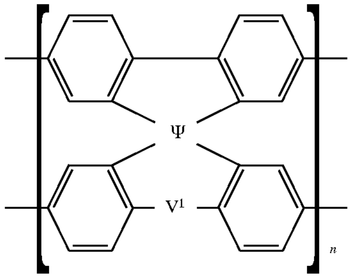

wherein:

Ψ=Si $V^1$=CO and

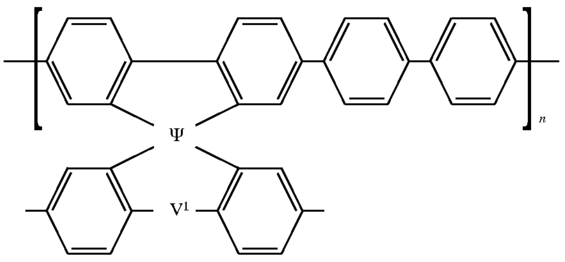

wherein:

Ψ=Si $V^1$=CO.

Particular preference is given to compounds of the formula (II) in which:

Q, $K^1$ are identical or different and are

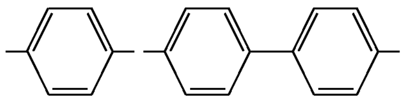

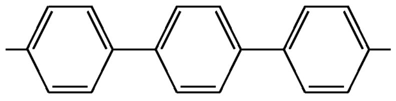

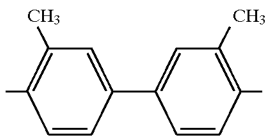

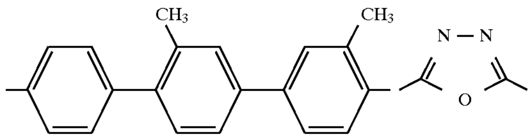

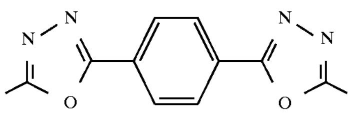

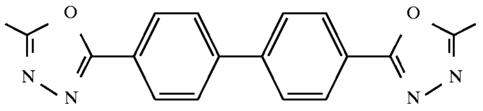

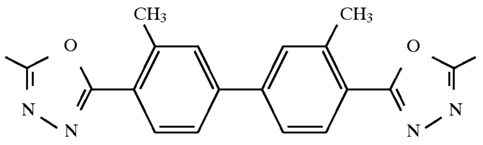

-continued

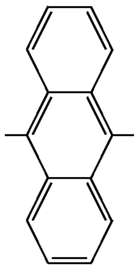

where:

m, n are identical or different and are 0 or 1;

M, L are H, Br, Cl, F, CN, $NO_2$ or $CF_3$, or a straight-chain or branched alkyl group having from 1 to 22 carbon atoms, where one or more, preferably one, —$CH_2$— groups can be replaced by —O—, —CO—O—, —O—CO— and one or more hydrogen atoms can be replaced by F; or with the following polymers being excepted:

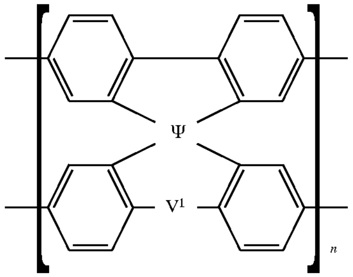

wherein:

Ψ=Si $V^1$=CO and

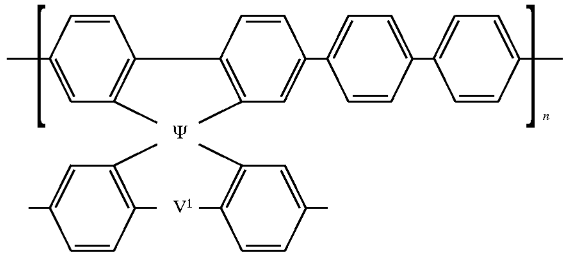

wherein:

Ψ=Si $V^1$=CO.

Very particular preference is given to compounds of the formula (II) in which:

Q, $K^1$ are identical or different and are

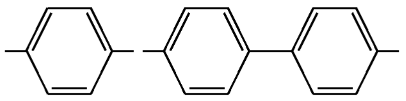

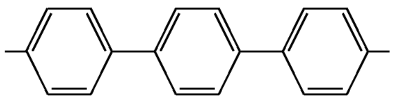

-continued

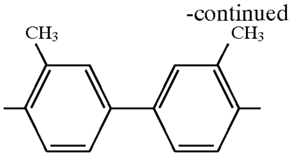

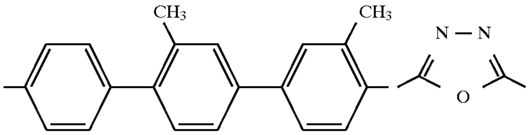

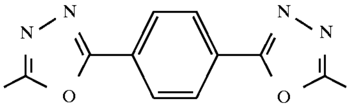

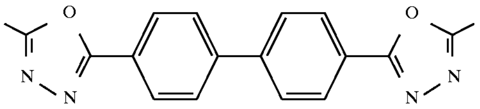

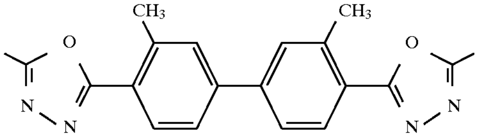

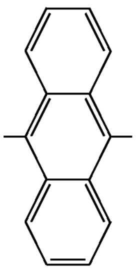

where:

m+n is 0 or 1;

M, L are H, Br, Cl, F. CN, $NO_2$ or $CF_3$, or a straight-chain or branched alkyl group having from 1 to 22 carbon atoms, where one or more, preferably one, —$CH_2$— groups can be replaced by —O—, —CO—O—, —O—CO— and one or more hydrogen atoms can be replaced by F;

with the following polymers being excepted:

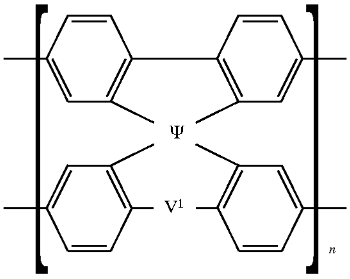

wherein:

Ψ=Si $V^1$=CO and

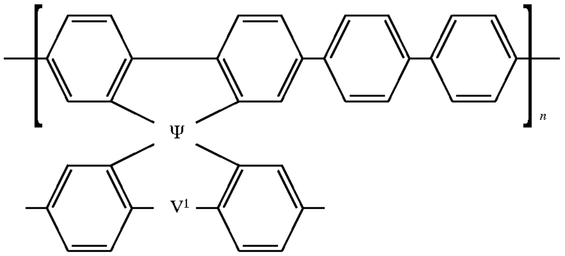

wherein:

Ψ=Si $V^1$=CO.

For some applications it can be advantageous to replace one or more or all hydrogen atoms, preferably those on aromatic rings, by F atoms.

The compounds of the invention having the formula (I) are homopolymers or copolymers, i.e. the compounds of the formula (I) can also have different repeating units.

The polymers of the invention having the formula (I) also have a considerably increased solubility in organic solvents and good film-forming properties. This makes the production of electroluminescence devices easier and increases their life. In addition, the covalently bonded arrangement of the substituents via the spiro atoms, perpendicular to the conjugated main chain, allows certain properties to be adjusted in the build-up of the molecule without interfering with the conjugation in the main chain. Thus, the polymer chain can have, for example, charge transport or charge injection properties while the substituents have light-emitting properties. The emission properties of the compounds used according to the invention can be adjusted across the entire range of the visible spectrum by selection of suitable substituents. The spatial proximity of the two halves fixed by the covalent linkage is here favorable for energy transfer (see, for example, B. Liphardt, W. Lüttke, Liebigs Ann. Chem. 1981, 1118).

The compounds of the invention having the formula (I) are well suited to producing blue electroluminescence.

The polymers of the invention can be prepared by literature methods known per se as are described in standard works on organic synthesis, e.g. Houben-Weyl, Methoden der Organischen Chemie, Georg-Thieme-Verlag, Stuttgart and in the volumes of the series "The Chemistry of Heterocyclic Compounds", A. Weissberger, E. C. Taylor (eds.), in particular volume 13/5, pp. 30–87.

The preparation is carried out under reaction conditions that are known and suitable for the reactions mentioned. Use can also be made of variants known per se that are not mentioned in more detail here.

Starting compounds used for the preparation of the polymers of the invention are preferably monomers having a 9,9'-spirobi-9-stannafluorene, 9,9'-spirobi-9-germafluorene or particularly preferably 9,9'-spirobi-9-silafluorene building block, which is in each case substituted in the 2,7 or, if desired, 2',7' positions.

One method of synthesizing these monomers is based, for example, on the synthesis of 9,9'-spirobi-9-silafluorene, for example, from 2,2'-dibromobiphenyl and silicon tetrachloride via 2,2'-dilithiobiphenyl, as described by H. Gilman and R. D. Gorsich, J. Am. Chem. Soc. 1958, 80, p.1883, which is subsequently further substituted in an appropriate manner.

Possible ways of functionalizing the analogous carbon compound 9,9'-spirobiflourene are described in J. H.

Weisburger, E. K. Weisburger, F. E. Ray, J. Am. Chem. Soc. 1959, 72, 4253; F. K. Sutcliffe, H. M. Shahidi, D. Paterson, J. Soc. Dyers Colour 1978, 94, 306; and G. Haas, V. Prelog, Helv. Chim. Acta 1969, 52, 1202; they are also suitable for functionalizing the heterospiro compounds of the invention.

It can be advantageous to achieve the desired substitution pattern of the monomeric 9,9'-spirobi-9-silafluorene by spirolinkage of starting materials, which are already appropriately substituted, for example, using 2,7-difunctionalized 9,9-dichloro-9-silafluorenes, and then, if desired, further functionalizing the still free 2',7' positions after formation of the spirocenter (e.g. by halogenation or acylation, with subsequent C-C linkage after conversion of the acetyl groups into aldehyde groups, or by heterocycle formation after conversion of the acetyl groups into carboxylic acid groups).

The further functionalization can be carried out by literature methods known per se, as described in standard works on organic synthesis, e.g. Houben-Weyl, Methoden der Organischen Chemie, Georg-Thieme Verlag, Stuttgart and in the appropriate volumes of the series "The Chemistry of Heterocyclic Compounds" by A. Weissberger and E. C. Taylor (Editors).

For the synthesis of the groups Q, $K^1$, L, and M reference may be made, for example, to DE-A 23 44 732, 24 50 088, 24 29 093, 25 02 904, 26 36 684, 27 01 591 and 27 52 975 for compounds containing 1,4-phenylene groups, DE-A 26 41 724 for compounds containing pyrimidine-2,5-diyl groups; DE-A 40 26 223 and EP-A 03 91 203 for compounds containing pyridine-2,5-diyl groups; DE-A 32 31 462 for compounds containing pyridazine-3,6-diyl groups; N. Miyaura, T. Yanagi and A. Suzuki in Synthetic Communications 1981, 11, 513 to 519, DE-C-3 930 663, M. J. Sharp, W. Cheng, V. Snieckus in Tetrahedron Letters 1987, 28, 5093; G. W. Gray in J.Chem.Soc. Perkin Trans II 1989, 2041 and Mol. Cryst. Liq. Cryst. 1989, 172, 165, Mol. Cryst. Liq. Cryst. 1991, 204, 43 and 91; EP-A 0 449 015; WO 89/12039; WO 89/03821; EP-A 0 354 434 for the direct linkage of aromatics and heteroaromatics.

The preparation of disubstituted pyridines, disubstituted pyrazines, disubstituted pyrimidines and disubstituted pyridazines may be found, for example, in the appropriate volumes of the series "The Chemistry of Heterocyclic Compounds" by A. Weissberger and E. C. Taylor (Editors).

Starting from the abovementioned monomers, the polymerization to give the polymers of the invention having the formula (I) is possible by a number of methods.

For example, derivatives of 9,9'-spirobi-9-silafluorene can be polymerized oxidatively (e.g. using $FeCl_3$; see, for example, P. Kovacic, N. B. Jones, Chem. Ber. 1987, 87, 357 to 379; M. Weda, T. Abe, H. Awano, Macromolecules 1992, 25, 5125) or electrochemically (see, for example, N. Saito, T. Kanbara, T. Sato, T. Yamamoto, Polym. Bull. 1993, 30, 285).

Likewise, the polymers of the invention having the formula (I) can be prepared from 2,7-difunctionalized 9,9'-spirobi-9-silafluorene derivatives. Dihaloaromatics can be polymerized in the presence of copper/triphenylphosphine (see, for example, G. W. Ebert, R. D. Rieke, J. Org. Chem. 1988, 53, 44829) or nickel/triphenylphosphine catalysts (see, for example, H. Matsumoto, S. Inaba, R. D. Rieke, J. Org. Chem. 1983, 48, 840).

Aromatic diboronic acids and aromatic dihalides or mixed aromatic halide-boronic acids can be polymerized in the presence of palladium catalysts by means of coupling reactions (see, for example, M. Miyaura, T. Yanagi, A. Suzuki, Synth. Commun. 1981, 11, 513; R. B. Miller, S. Dugar, Organometallics 1984, 3, 1261).

Aromatic distannans can be polymerized in the presence of palladium catalysts, for example as described in J. K. Stille, Angew. Chem. Int. Ed. Engl. 1986, 25, 508.

Furthermore, the abovementioned dibromo compounds can be converted into the dilithio or digrignard compounds which can then be polymerized with further dibromo compound by means of $CuCl_2$ (see, for example, G. Wittig, G. Klar, Liebigs Ann. Chem. 1967, 704, 91; H. A. Staab, F. Bunny, Chem. Ber. 1967, 100, 293; T. Kaufmann, Angew. Chem. 1974, 86, 321 to 354) or by electron transfer of unsaturated 1,4-dihalo compounds (see, for example, S. K. Taylor, S. G. Bennett, K. J. Harz, L. K. Lashley, J. Org. Chem. 1981, 46, 2190).

The synthesis of the polymers of the invention having the formula (I) can, however, also be carried out by polymerization of a 2,7-difunctionalized 9,9'-spirobi-9-silafluorene derivative with a further, appropriately difunctionalized compound.

Thus, for example, 2,7-dibromo-9,9'-spirobi-9-silafluorene can be polymerized with biphenyl4,4'-bisboronic acid. This makes it possible to build up various heterocyclic units simultaneously with the polymerization step, e.g. the formation of oxadiazole units from difunctional carboxylic acid halides and difunctional carboxylic acid hydrazides or from the corresponding dicarboxylic acid and hydrazine sulfate (B. Schulz, E. Leibnitz, Acta Polymer. 1992, 43, page 343; JP-A 05/178, 990, or alternatively from dicarboxylic acid halides and bistetrazoles (C. A. Abshire, C. S. Marvel, Makromol. Chem. 1961, 44 to 46, page 388).

To prepare copolymers, for example, different compounds of the formula (I) can be copolymerized.

The work-up is carried out by known methods with which those skilled in the art are familiar, as are described, for example, in R. J. Young, P. A. Lovell, Introduction to Polymers, Chapman & Hall, London, 1991. For example, the reaction mixture can be filtered, diluted with aqueous acid, extracted and the crude product obtained after drying and taking off the solvent can be further purified by reprecipitation.

Terminal bromine atoms can be removed reductively, for example using $LiAlH_4$ (see, for example, J. March, Advanced Organic Chemistry, 3rd edition, McGraw-Hill, p. 510).

The polymers of the invention can be used as electroluminescence materials.

The invention therefore also provides for the use of polymers of the formula (I) as electroluminescence material.

For the purposes of the invention, electroluminescence materials are materials that can be used as an active layer in an electroluminescence device. Active layer means that the layer is capable of emitting light on application of an electric field (light-emitting layer) and/or that it improves the injection and/or the transport of the positive and/or negative charges (charge injection or charge transport layer). Particular mention should be made of the excellent hole conductor properties of the materials of the invention, which can be used, for example, as hole transport layers in photocopiers and laser printers.

The invention therefore also provides an electroluminescence material comprising one or more polymers of the formula (I).

The electroluminescence material of the invention usually comprises one or more polymers of the formula (I) as main component, i.e. in an amount of greater than 50% by weight, or as additive.

For use as electroluminescence materials, the solutions of the polymers of the formula (I) are generally applied in the form of a film to a substrate by known methods with which those skilled in the art are familiar, for example casting, dipping, spincoating or curtain coating.

The invention therefore further provides a process for producing an electroluminescence material, which comprises applying a polymer of the formula (I) in the form of a film to a substrate.

The invention additionally provides an electroluminescence device, comprising one or more active layers, where at least one of these active layers comprises one or more polymers of the invention having the formula (I). The active layer can be, for example, a light-emitting layer and/or a transport layer and/or a charge injection layer.

The general structure of such electroluminescence devices is described, for example, in U.S. Pat. No. 4,539,507 and U.S. Pat. No. 5,151,629. Polymer-containing electroluminescence devices are described, for example, in WO 90/13148 or EP-A 0 443861.

Electroluminescence devices usually comprise an electroluminescing layer between a cathode and an anode, where at least one of the electrodes is transparent. In addition, an electron injection and/or electron transport layer can be introduced between the electroluminescing layer and the cathode and/or a hole injection and/or hole transport layer can be introduced between the electroluminescing layer and the anode. Suitable cathode materials are, for example, Ca, Mg, Al, In, Mg/Ag. Suitable anode materials are, for example, Au or ITO (indium oxide/tin oxide) on a transparent substrate, for example of glass or a transparent polymer.

In operation, the cathode is placed at a negative potential relative to the anode. This results in injection of electrons from the cathode into the electron injection layer/electron transport layer or directly into the light-emitting layer. At the same time, holes from the anode are injected into the hole injection layer/hole transport layer or directly into the light-emitting layer.

The injected charge carriers move toward one another through the active layers under the influence of the applied potential. This leads to electron/hole pairs at the interface between charge transport layer and light-emitting layer or within the light-emitting layer and these recombine with emission of light. The color of the emitted light can be varied by means of the compound used as the light-emitting layer, with not only copolymers but also mixtures of the polymers of the invention with other electrooptically active or passive materials being expressly included.

Electroluminescence devices are employed, for example, as selfilluminating display elements such as control lamps, alphanumeric displays, signs and in optoelectronic couplers. Owing to their good hole transport properties, the materials of the invention are also suitable as photoconductor elements, for example in photocopiers and laser printers.

EXAMPLES

The following examples are illustrative of some of the products and methods of making the same falling within the scope of the present invention. They are, of course, not to be considered in any way limitative of the invention. Numerous changes and modifications can be made with respect to the invention.

Example 1

2,2'-Dilithiobiphenyl 26 ml of a solution of 28 mmol of n-BuLi in absolute diethyl ether (ether) was added dropwise over a period of 5 minutes to an ice-cooled, vigorously stirred solution of 4.0 g (12.9 mmol) of 2,2'-dibromobiphenyl in 40 ml of ether and the mixture was subsequently stirred for 5 hours at room temperature.

Example 2

Bis(biphenyl-2,2'-diyl)silane (9,9'-Spirobi-9-silafluorene)

A solution of 24 mmol of 2,2'-dilithiobiphenyl in 70 ml of ether prepared as described in Example 1 was added dropwise over a period of 1 hour to a vigorously stirred solution of 1.87 g (11 mmol) of silicon tetrachloride in 30 ml of ether. The mixture was stirred for a further 1.5 hours at room temperature and refluxed for 3 hours. Subsequently, 50 ml of benzene were added and the mixture was refluxed for a further 2 hours. After shaking with 100 ml of water, the organic phase was dried over magnesium sulfate, filtered and the major part of the ether was distilled off on a rotary evaporator. 1.45 g of crude product having an mp. of from 222° to 225° C. were isolated from the cooled solution. After evaporation, the filtrate gave a further 0.6 g (total yield: 56%). Crystallization from ethanol gives a product having a melting point of 227° C.

| Elemental analysis: | % | C | H | Si |
|---|---|---|---|---|
| | Calc. | 86.72 | 4.85 | 8.44 |
| | Found | 86.86 | 4.98 | 8.33 |

The remarkably high stability of this compound is shown by the boiling point of 460° C. which is reached without visible decomposition.

Example 3

Bis(biphenyl-2,2'-diyl)germane (9,9'-spirobi-9-germafluorene)

A solution of 50 mmol of 2,2'-dilithiobiphenyl prepared in 140 ml of ether, as described in Example 1, was reacted as described in Example 2 with 5.35 g (25 mmol) of germanium tetrachloride. Work-up and recrystallization from ethyl acetate gave 2.77 g (29%) of product. White prisms, melting point 245° C., boiling point 470° C. without decomposition.

| Elemental analysis | % | Ge |
|---|---|---|
| | Calc. | 19.23 |
| | Found | 18.88 |

Example 4

Biphenyl-2,2'-diylsilicon dichloride 78 mmol of 2,2'-dilithiobiphenyl prepared in 230 ml of ether, as described in Example 1, were reacted as described in Example 2 with 252 g (1.48 mol, i.e. 18-fold excess) of silicon tetrachloride. Distilling off the excess $SiCl_4$ and work-up resulted in 3.5 g of a solid product which was recrystallized from ethyl acetate to give 2.89 g (22%) of bis(biphenyl-2,2'-diyl)silane, as described in Example 2. The collected mother liquors were evaporated and the remaining oil was distilled at 0.01 mbar, with a small amount of biphenyl going over as first fraction and 7.41 g (38%) of biphenyl-2,2'-diylsilicon dichloride going over as main fraction at from 108° to 110° C.

| Elemental analysis: | % | Cl | Si |
|---|---|---|---|
| | Calc. | 28.3 | 11.33 |
| | Found | 26.5 | 10.75 |

Example 5

10,10-Biphenyl-2,2'-diylphenoxasilin [348.481]

A solution of 120 mmol of 2,2'-dilithio(diphenyl ether) in 180 ml of THF, prepared as described in H. Gilman, W. J. Trepka, J. Org. Chem. 1962, 27, 1418, was added to a solution of 37.7 g (150 mmol) of biphenyl-2,2'-diylsilicon dichloride, prepared as described in Example 4, in 200 ml of THF. The mixture was stirred for 12 hours at 20° C., hydrolyzed with a mixture of ice and sulfuric acid and the aqueous phase was extracted with ether. After work-up by distillation at <0.05 mm, the main fraction going over at 150° C. was recrystallized from ethanol. Yield: 12.5 g (30%).

Example 6

Bis(bibenzyl-2,2'-diyl)silane

A solution of 2.1 ml (20 mmol) of silicon tetrachloride in 50 ml of THF was added dropwise to a solution of 2,2'-dilithiobibenzyl, which had previously been prepared from 15 g (40 mmol) of 2,2'-dibromobibenzyl and 97 mmol of 1.7 molar n-butyllithium in a hexane fraction. The mixture was refluxed for 1 hour and worked up as in Example 5. 5.0 g of a solidifying oil went over between 125° and 210° C. at 0.05 mm and this was recrystallized twice to give 1.0 g (13%) of bis(bibenzyl-2,2'-diyl)silane having an mp. of 175° C.

| Elemental analysis: | % | C | H |
|---|---|---|---|
| | Calc. | 86.60 | 6.19 |
| | Found | 86.21 | 6.05 |

Example 7

Bis(stilbene-2.2'-diyl)silane via bis(αα'(β')-dibromobibenzyl-2,2'-diyl)silane

A slurry of 1.94 g (5 mmol) of bis(bibenzyl-2,2'-diyl) silane, prepared as described in Example 6, and 1.78 g (10 mmol) of N-bromosuccinimide in 100 ml of tetrachloromethane were heated to boiling while being irradiated with a 300 W incandescent tungsten lamp. The succinimide formed was filtered off with suction, the filtrate was evaporated to dryness on a rotary evaporator, the residue was taken up in 15 ml of toluene and admixed with 2 ml of 2-dimethylaminoethanol. The mixture was stirred for 48 hours and then heated to boiling for 6 hours. The toluene was removed under reduced pressure, the residue was admixed with 50 ml of 5% strength by weight sodium hydroxide solution and shaken with ether. After drying over magnesium sulfate, the ether was evaporated and the residue was purified by chromatography on 30 g of silica gel using toluene/cyclohexane as eluant.

Example 8

3,3',5,5'-Tetraphenyl-9-sila-9-spiro-9H-bifluorene via tetrakis(biphenyl4-yl)silane 10.8 g (46.3 mmol) of 4-bromobiphenyl were dissolved together with 1.95 g (11.6 mmol) of silicon tetrachloride in 100 ml of absolute ether and subsequently admixed with 2.5 g (110 mmol) of sodium. The mixture was heated under reflux until the metal had dissolved and stirred further for 4 hours at room temperature. After removing the ether, the residue was extracted with toluene in a Soxhlet apparatus. Yield: 6.7 g (90%). Mp. 281° C. from xylene.

5.4 g (10 mmol) of tetrakis(biphenyl-4-yl)silane were dissolved in 200 ml of 1,2-dichlorobenzene and 6.5 g (40 mmol) of iron(III) chloride were added a little at a time while passing nitrogen through the solution. The mixture was heated to boiling over a period of 3 hours. When HCl could no longer be detected as $NH_4Cl$ in the waste gas, the mixture was evaporated on a rotary evaporator, the residue was digested a number of times using 5% strength hydrochloric acid and the residue was recrystallized from xylene with addition of 1 g of silica gel. Yield: 2.7 g (51%).

Example 9

Biphenyl-2,2'-diyldibenzosilinane

Bis(2-chlorophenyl)methane was prepared as described in Chang and Gorey, Organomet. Chem. 8, 1890 (1989). 0.1 mol of this substance was lithiated as described in Example 1 using 0.22 mol of BuLi. The ether solution obtained was added dropwise to a solution of 25.1 g (0.1 mol) of biphenyl-2,2'-diylsilicon dichloride, prepared as described in Example 4, in 150 ml of THF. The mixture was stirred for 12 hours at room temperature, hydrolyzed with a mixture of ice and sulfuric acid and the aqueous phase was extracted with ether. After work-up by distillation in a high vacuum of <0.05 mm of Hg, the main fraction going over at about 150° C. was recrystallized from ethanol. Yield: 13.9 g (40%).

Example 10

Biphenyl-2,2'-diyldibenzosilinan-9-one 10.4 g (30 mmol) of biphenyl-2,2'-diyldibenzosilinane, prepared as described in Example 9, were admixed with a solution of 3.33 g (30 mmol) of selenium dioxide dissolved in 22 ml of 1,4-dioxane and 1.4 ml of water. The mixture was then heated to boiling, the precipitated selenium was filtered off whilst still hot and extracted with hot dioxane. Recrystallization from i-propanol gave 9.9 g of product (91%).

Example 11 a) 10.10'-(4.4'-Dinitrobiphenyl-2,2'-diyl)dibenzosilinan-9-one 5.10 g (21 mmol) of $Cu(NO_3)_2.3H_2O$ are taken up at room temperature in 40 ml of acetic anhydride and stirred. After a few minutes, the internal temperature rises to from about 40° to 45° C. with the blue suspension becoming turbid. 3.6 g (10 mmol) of biphenyl-2,2'-diyldibenzosilinan-9-one are subsequently added and the mixture is stirred further at 40° C.

After 4 hours at 40° C., the reaction is complete. The color of the suspension has changed to turquoise. It is carefully stirred into about 200 ml of water and shaken a number of times with chloroform. After evaporating the organic phase on a rotary evaporator and dissolving the residue in chloroform, the solution is precipitated with hexane: 4.7 g of colorless product.

b) 10,10'-(4,4'-Diaminobiphenyl-2,2'-diyl)dibenzosilinan-9-one

A mixture of 5 g of 10,10'-(4,4'-dinitrobiphenyl-2,2'-diyl) dibenzosilinan-9-one and 4.5 g of iron powder are refluxed in 150 ml of ethanol while 15 ml of concentrated HCl are added dropwise over a period of 30 minutes. After refluxing for a further 30 minutes, excess iron is filtered off. The green filtrate is added to a solution of 400 ml of water, 15 ml of concentrated $NH_4OH$ and 20 g of sodium potassium tartrate. The colorless diamine is filtered off from the dark green solution of the iron complex. To purify the diamine, it is dissolved in dilute HCl, stirred at room temperature with activated carbon (Darco) and filtered. The filtered solution is neutralized dropwise with $NH_4OH$ while stirring mechanically and the precipitated product is filtered off with suction. This gives 3.59 of virtually colorless 10,10'-(4,4'-diaminobiphenyl-2,2'-diyl)dibenzosilinan-9-one which is further recrystallized from methanol.

c) 10,10'-(4.4'-Dibromobiphenyl-2,2'-diyl)dibenzosilinan-9-one 2.0 g of 10,10'-(4,4'-diaminobiphenyl-2,2'-diyl) dibenzosilinan-9-one are dissolved in 20 ml of water and 5 ml of concentrated hydrobromic acid, cooled to about 0° C. and slowly admixed while maintaining this temperature with a solution of 0.8 g of $NaNO_2$ in about 5 ml of water. The mixture is stirred at this; temperature for about 30 minutes and the solution of the resulting bisdiazonium salt is poured into an ice-cooled solution of 1 g of CuBr in 10 ml of HBr. The resulting solution is stirred at 100° C., with gas evolution occurring and the resulting product precipitating as a white solid. After gas evolution is complete, the product is filtered off with suction, washed with $NaHCO_3$ solution until neutral and washed with water until free of salts. It is subsequently reprecipitated from chloroform/hexane: 1.3 g of virtually colorless powder.

The above description of the invention is intended to be illustrataive and not limiting. Various changes or modifications in the embodiments described may occur to those skilled in the art. These can be made without departing from the spirit or scope of the invention.

We claim:

1. A conjugated polymer comprising repeating units of the formula (I),

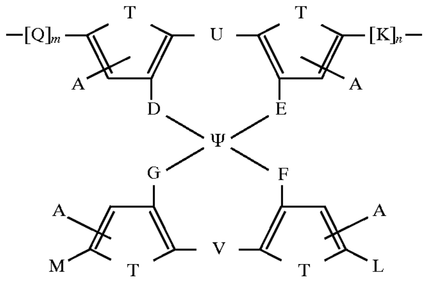

(I)

where the symbols and indices have the following meanings:

Ψ is an element selected from the group consisting of Si, Ge, Sn and Pb;

D, E, $F^1$, G are identical or different and are —$CR^1R^2$—, —O—, —S—, —$NR^3$— or a chemical bond; where $R^1$, $R^2$, $R^3$ are identical or different and are each a $C_1$–$C_{20}$-hydrocarbon radical or H or $R^1$ and $R^2$ can together form an unsubstituted or substituted ring;

$U^1$ is —$CR^4$=$CR^5$— or a chemical bond; where $R^4$, $R^5$ are identical or different and are as defined for $R^1$, $R^2$, $R^3$ or are fluorine or $CF_3$;

$V^1$ is as defined for $U^1$ or is —$CR^1R^2$—, —O—, —S—, —$NR^3$—, —$SiR^1R^2$—, $SO_2$—, —SO—, —CO—, where $R^1$, $R^2$, $R^3$, $R^4$, and $R^5$ are as defined above;

A is identical or different and is H or a $C_1$–$C_{20}$-hydrocarbon radical, which can also contain heteroatoms;

T is —O—, —S—, —$NR^3$—, —$CR^1R^2$—, —CH=N—, —CA=CA—, —CH=CA—, —CH=CF— or —CF=CF—, where $R^1$, $R^2$, $R^3$ and A are as defined above;

$K^1$, Q are identical or different hydrocarbon radicals which may contain heteroatoms and have conjugated electron systems; where $K^1$, L, M, and Q can also be joined to the groups A in the respective ortho positions to form a ring which is saturated, partially unsaturated or fully unsaturated;

M, L are H, Br, Cl, F, CN, $NO_2$ or $CF_3$, or a straight-chain or branched alkyl group having from 1 to 22 carbon atoms, where one or more —$CH_2$— groups can be replaced by —O—, —CO—O—, —O—CO— and one or more hydrogen atoms can be replaced by F; or m, n are identical or different and are 0, 1, 2, 3 or 4;

with the following polymers being excepted:

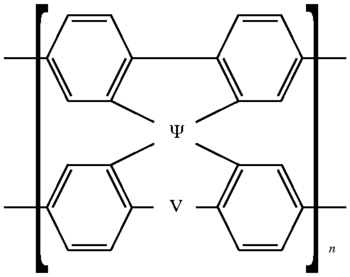

wherein:

Ψ=Si, $V^1$=CO.

2. A polymer as claimed in claim 1, comprising from 2 to 1000 repeating units.

3. A polymer as claimed in claim 1, comprising repeating units of the formula

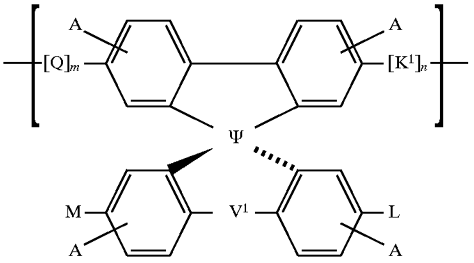

(II)

where the symbols and indices have the following meanings:

Ψ is Sn, Ge or Si;

Q, $K^1$, are identical or different and are each one to fifteen identical or different arylene and/or heteroarylene and/or vinylene groups which may be substituted or unsubstituted;

A are identical or different substituents and can be as defined for the formula (I) in claim 1;

M, L are H, Br, Cl, F, CN, $NO_2$ or $CF_3$, or a straight-chain or branched alkyl group having from 1 to 22 carbon atoms, where one or more —$CH_2$—groups can be replaced by —O—, —CO—O—, —O—CO— and one or more hydrogen atoms of the $C^1$–$C^{22}$-alkyl group can be replaced by F;

m, n are identical or different and are 0 or 1;

with the following polymers being excepted:

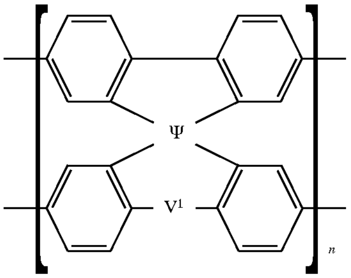

wherein:

Ψ=Si $V^1$=CO and

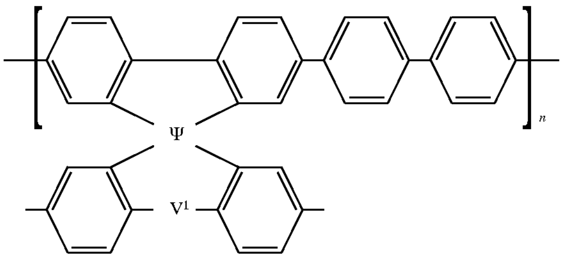

wherein:

Ψ=Si $V^1$=CO.

4. A polymer as claimed in claim 2, comprising repeating units of the formula (II),

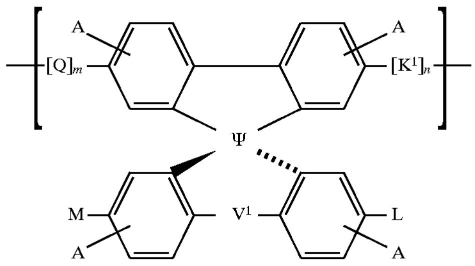

(II)

where the symbols and indices have the following meanings:

Ψ is Sn, Ge or Si;

Q, $K^1$, are identical or different and are each one to fifteen identical or different arylene and/or heteroarylene and/or vinylene groups which may be substituted or unsubstituted;

A are identical or different substituents and can be as defined for the formula (I) in claim 1;

M, L are H, Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms of the $C^1$–$C^{22}$-alkyl group can be replaced by F;

m, n are identical or different and are 0 or 1;

with the following polymers being excepted:

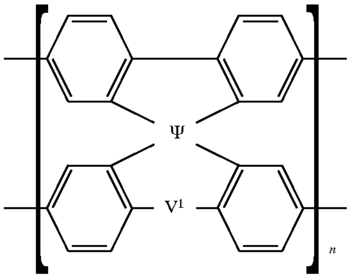

wherein:

Ψ=Si $V^1$=CO and

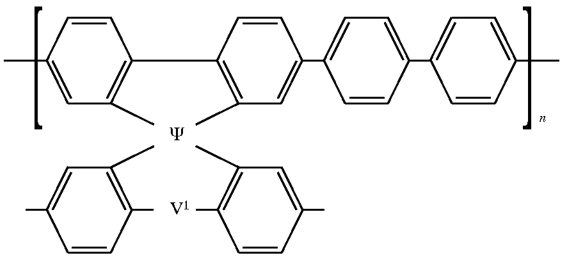

wherein:

Ψ=Si $V^1$=CO.

5. A polymer as claimed in claim 3, wherein the symbols and indices in the formula (II) have the following meanings:

A are identical or different and are $R^1$, $R^2$, $R^3$ and/or $R^4$;

Q, $K^1$ are identical or different and are

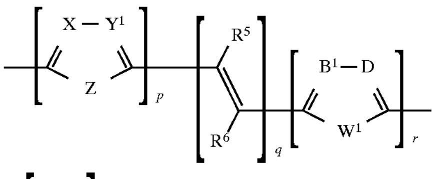

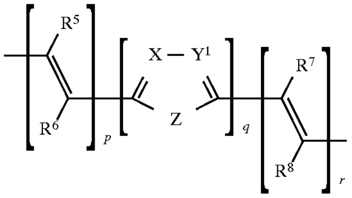

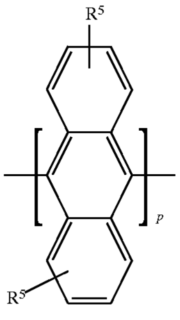

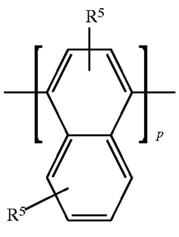

-continued

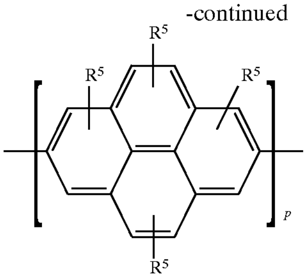

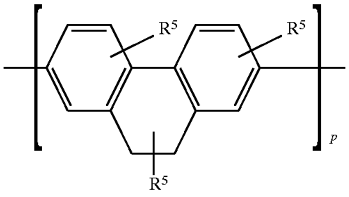

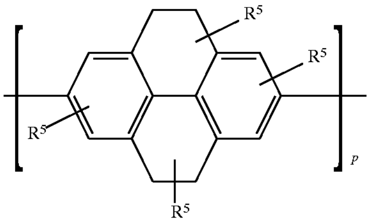

X, $Y^1$, $B^1$, D are identical or different and are $CR^5$ or N;

Z, $W^1$ are identical or different and are O, S, $NR^5$, $CR^5R^6$, $—CR^5{=}CR^6—$, $—CR^5{=}N—$;

p, q, r are, independently of one another, identical or different and are 0, or 1 to 5;

$R^1$, $R^2$, $R^3$, $R^4$, $R^5$, $R^6$, $R^7$, $R^8$ are identical or different and are H, Br, Cl, F, CN, $CF_3$, a straight-chain or branched alkyl, alkoxy or ester group having from 1 to 22 carbon atoms, aryl and/or aryloxy groups, where the aromatic can be substituted by $C_1$–$C_{22}$-alkyl, $C_1$–$C_{22}$-alkoxy, Br, Cl, F, CN;

M, L are H or Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms can be replaced by F;

with the following polymers being excepted:

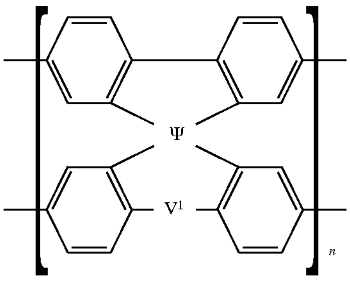

wherein:

$\Psi{=}Si$ $V^1{=}CO$ and

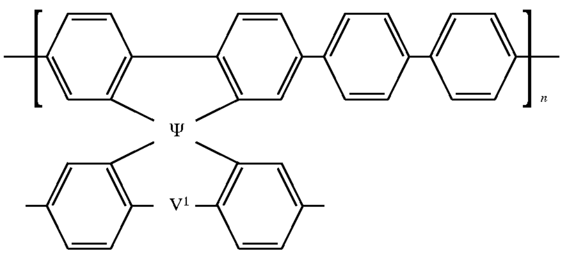

wherein:

$\Psi{=}Si$ $V^1{=}CO$.

6. A polymer as claimed in claim 4, wherein the symbols and indices in the formula (II) have the following meanings:

A are identical or different and are $R^1$, $R^2$, $R^3$ and/or $R^4$;

Q, $K^1$ are identical or different and are

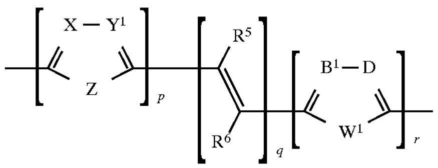

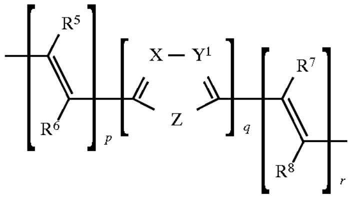

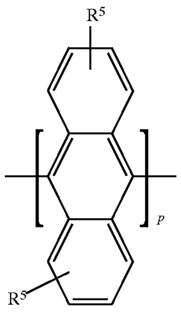

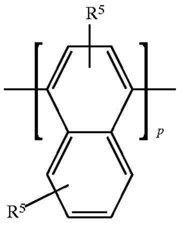

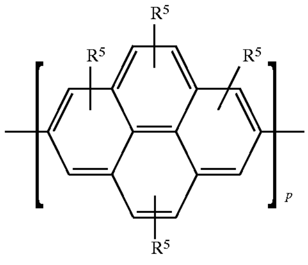

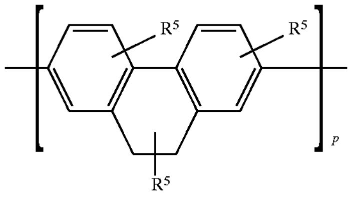

-continued

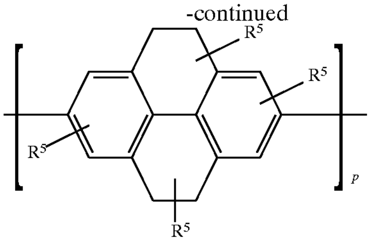

X, $Y^1$, $B^1$, D are identical or different and are $CR^5$ or N;

Z, $W^1$ are identical or different and are O, S, $NR^5$, $CR^5R^6$, $—CR^5{=}CR^6—$, $—CR^5{=}N—$;

p, q, r are, independently of one another, identical or different and are 0, or 1 to 5;

$R^1$, $R^2$, $R^3$, $R^4$, $R^5$, $R^6$, $R^7$, $R^8$ are identical or different and are H, a straight-chain or branched alkyl, alkoxy or ester group having from 1 to 22 carbon atoms, aryl and/or aryloxy groups, where the aromatic can be substituted by $C_1$–$C_{22}$-alkyl, $C_1$–$C_{22}$-alkoxy, Br, Cl, F, CN, and/or $NO_2$, Br, Cl, F, CN, $NO_2$ or $CF_3$;

M, L are H or Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms can be replaced by F;

with the following polymers being excepted:

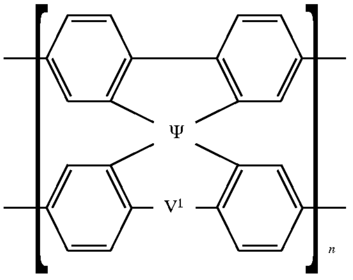

wherein:

Ψ=Si $V^1$=CO and

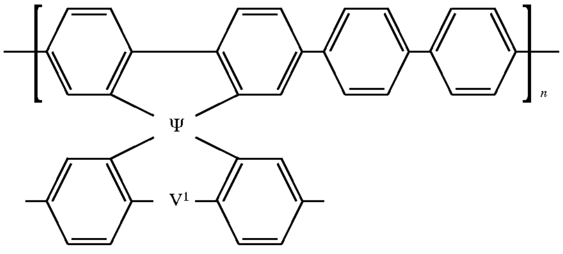

wherein:

Ψ=Si $V^1$=CO.

7. A polymer as claimed in claim 3, wherein the symbols and indices in the formula (II) have the following meanings:

Q, $K^1$ are identical or different and are

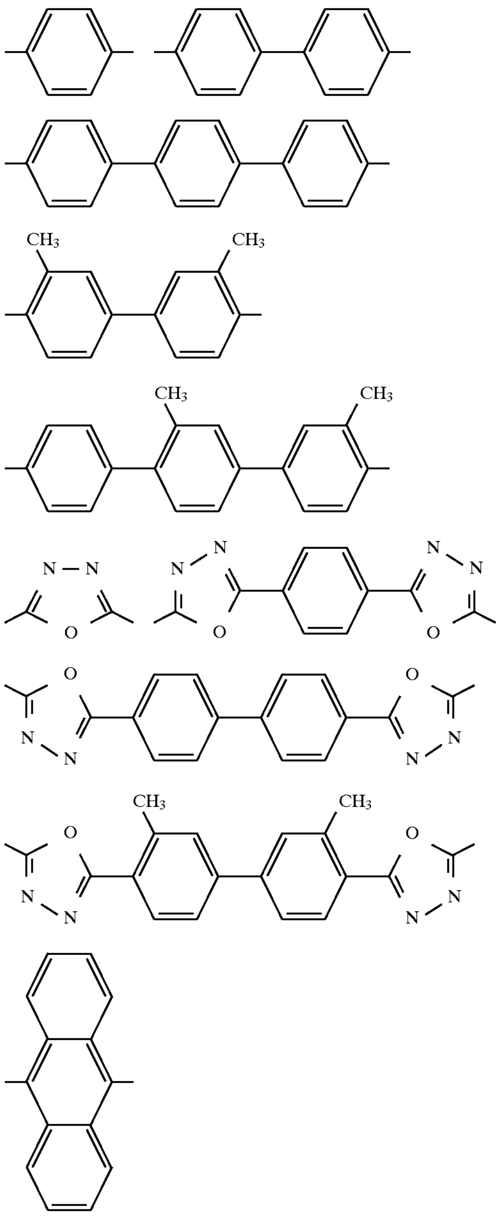

M, L are H, Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms can be replaced by F;

m, n are identical or different and are 0 or 1;

with the following polymers being excepted:

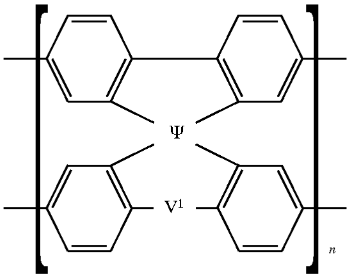

wherein:

Ψ=Si $V^1$=CO and

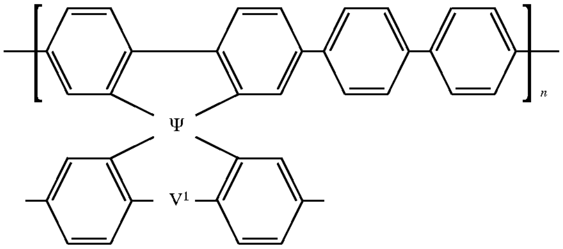

wherein:

Ψ=Si $V^1$=CO.

8. A polymer as claimed in claim 4, wherein the symbols and indices in the formula (II) have the following meanings:

Q, $K^1$ are identical or different and are

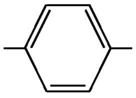

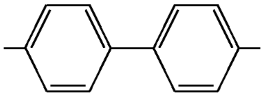

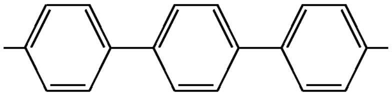

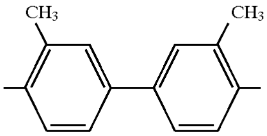

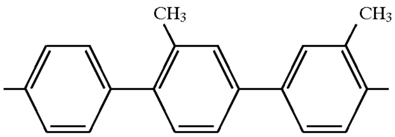

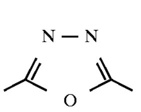

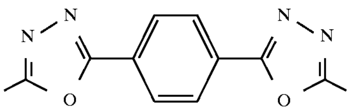

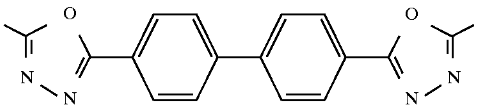

-continued

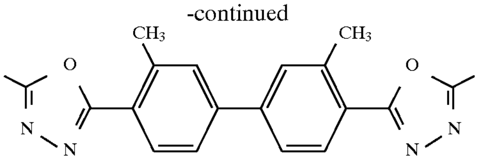

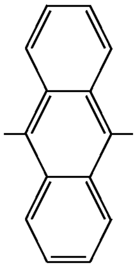

M, L are H, Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms can be replaced by F;

m, n are identical or different and are 0 or 1;

with the following polymers being excepted:

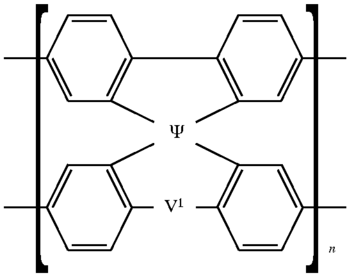

wherein:

Ψ=Si $V^1$=CO and

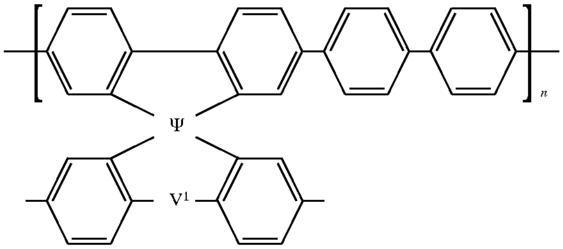

wherein

Ψ=Si $V^1$=CO.

9. A polymer as claimed in claim 5, wherein the symbols and indices in the formula (II) have the following meanings:

Q, $K^1$ are identical or different and are

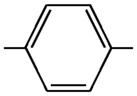

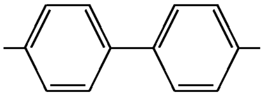

-continued

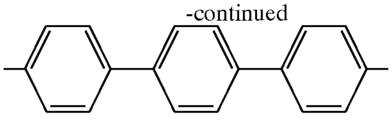

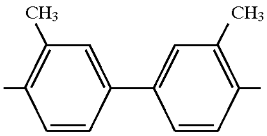

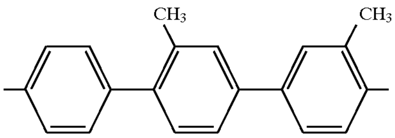

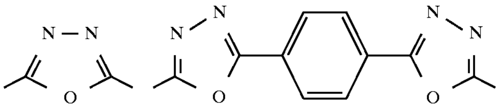

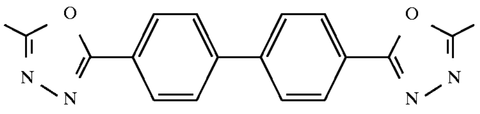

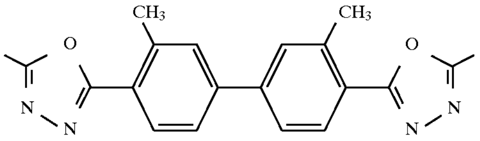

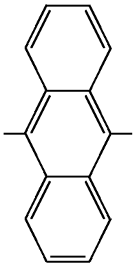

M, L are H, Br, Cl, F, CN, $NO_2$ or $CF_3$, or a straight-chain or branched alkyl group having from 1 to 22 carbon atoms, where one or more —$CH_2$— groups can be replaced by —O—, —CO—O—, —O—CO— and one or more hydrogen atoms can be replaced by F;

m, n are identical or different and are 0 or 1;

with the following polymers being excepted:

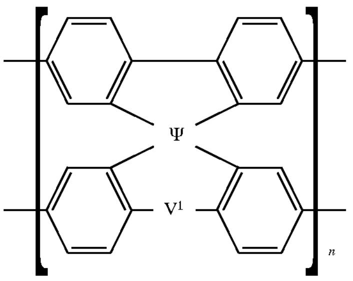

wherein:

Ψ=Si $V^1$=CO and

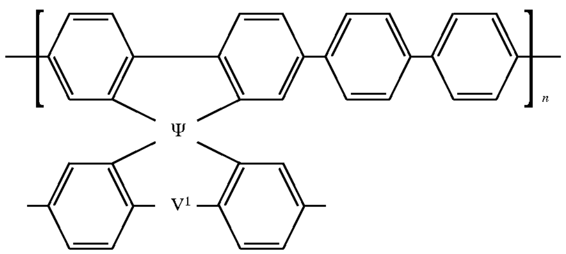

wherein:

Ψ=Si $V^1$=CO.

10. A polymer as claimed in claim 6, wherein the symbols and indices in the formula (II) have the following meanings:

Q, $K^1$ are identical or different and are

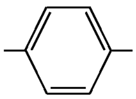

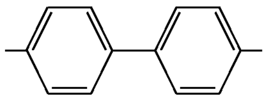

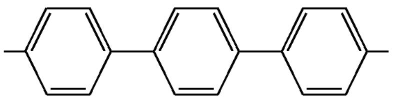

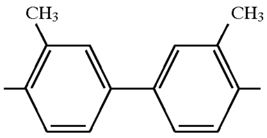

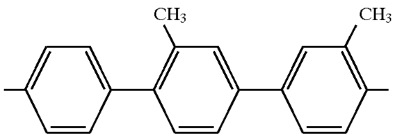

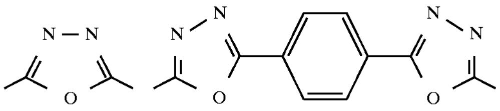

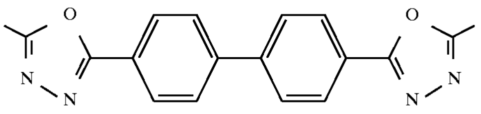

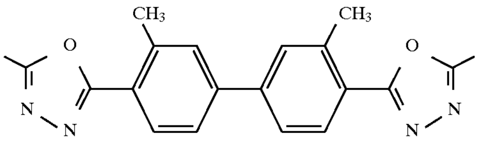

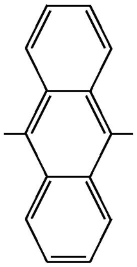

M, L are H, Br, Cl, F, CN, $NO_2$ or $CF_3$, or a straight-chain or branched alkyl group having from 1 to 22 carbon atoms, where one or more —$CH_2$— groups can be replaced by —O—, —CO—O—, —O—CO— and one or more hydrogen atoms can be replaced by F;

m, n are identical or different and are 0 or 1;

with the following polymers being excepted:

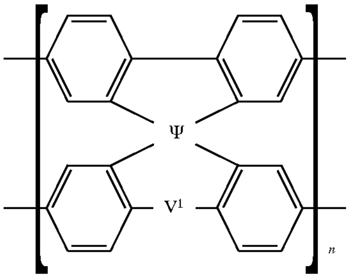

wherein:

Ψ=Si $V^1$=CO and

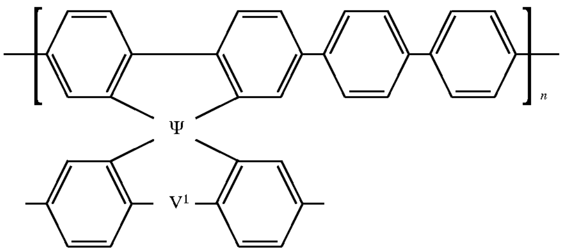

wherein:

Ψ=Si $V^1$=CO.

11. A polymer as claimed in claim 3, wherein the symbols and indices in the formula (II) have the following meanings:

Q, $K^1$ are identical or different and are

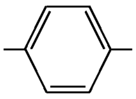

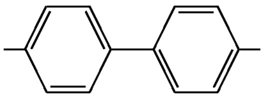

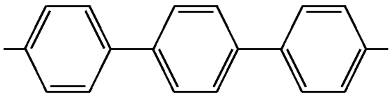

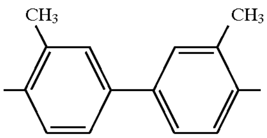

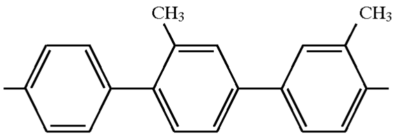

-continued

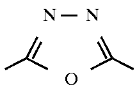

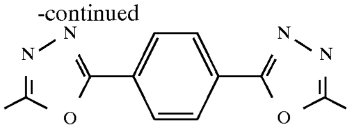

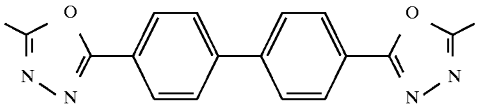

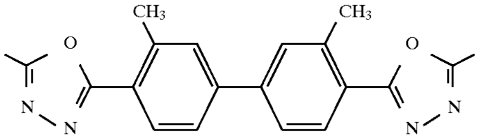

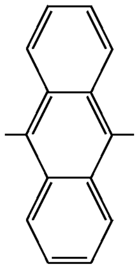

where:

M, L are H, Br, Cl, F, CN, $NO_2$ or $CF_3$, or a straight-chain or branched alkyl group having from 1 to 22 carbon atoms, where one or more —$CH_2$— groups can be replaced by —O—, —CO—O—, —O—CO— and one or more hydrogen atoms can be replaced by F;

m+n is 0 or 1 with the following polymers being excepted:

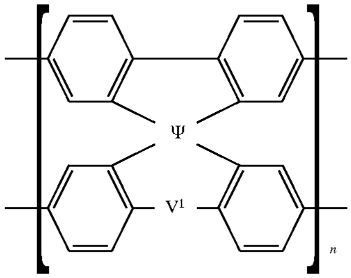

wherein:

Ψ=Si $V^1$=CO and

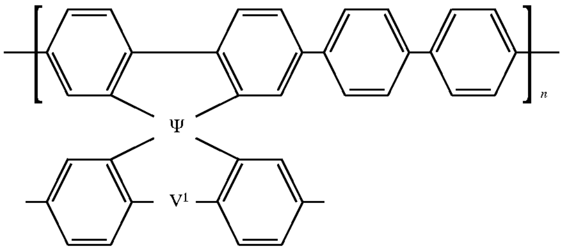

wherein:

Ψ=Si $V^1$=CO.

12. A polymer as claimed in claim 4, wherein the symbols and indices in the formula (II) have the following meanings:

Q, $K^1$ are identical or different and are

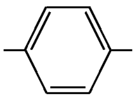
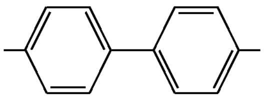
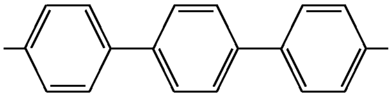
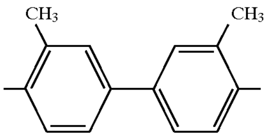
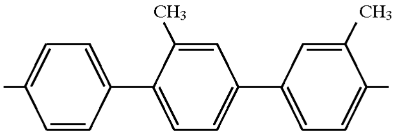
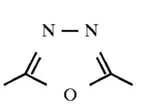
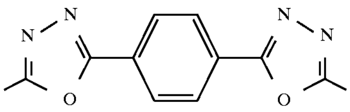
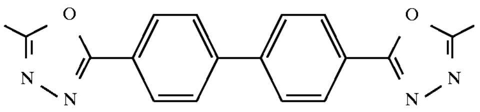
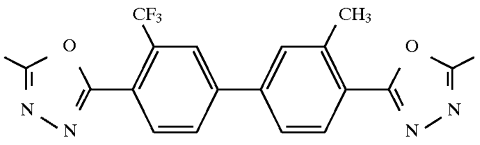
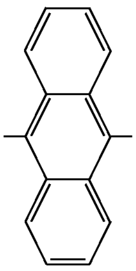

where:

M, L are H, Br, Cl, F, CN, $NO_2$ or $CF_3$, or a straight-chain or branched alkyl group having from 1 to 22 carbon atoms, where one or more —$CH_2$— groups can be replaced by —O—, —CO—O—, —O—CO— and one or more hydrogen atoms can be replaced by F;

m+n is 0 or 1 with the following polymers being excepted:

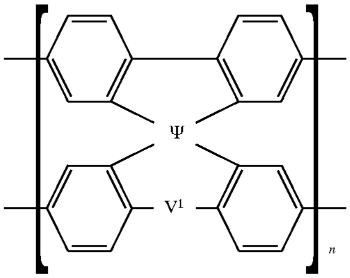

wherein:

Ψ=Si $V^1$=CO and

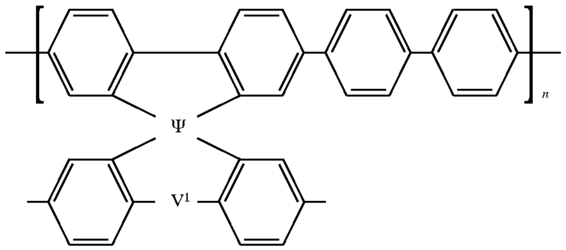

wherein:

Ψ=Si $V^1$=CO.

13. A polymer as claimed in claim 5, wherein the symbols and indices in the formula (II) have the following meanings:

Q, $K^1$ are identical or different and are

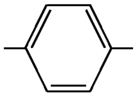
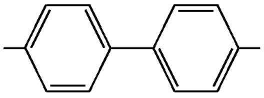
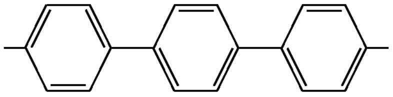
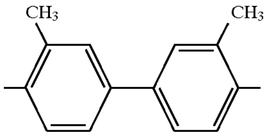
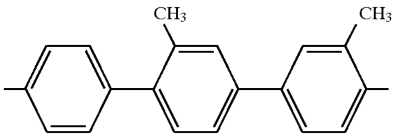
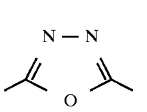
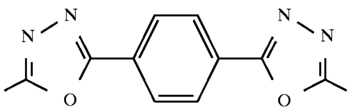
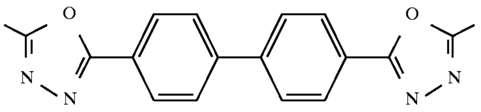

-continued

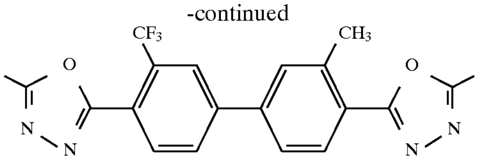

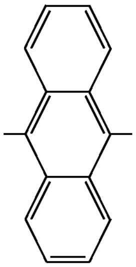

where:

M, L are H, Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms can be replaced by F;

m+n is 0 or 1 with the following polymers being excepted:

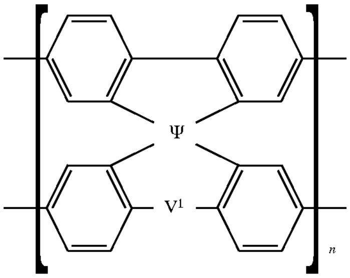

wherein:

Ψ=Si $V^1$=CO and

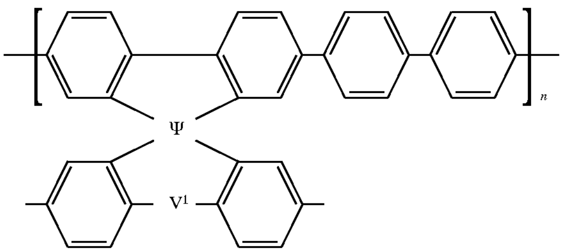

wherein:

Ψ=Si $V^1$=CO.

14. A polymer as claimed in claim 7, wherein the symbols and indices in the formula (I) have the following meanings:

Q, $K^1$ are identical or different and are

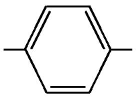

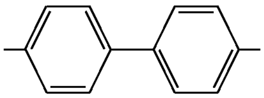

-continued

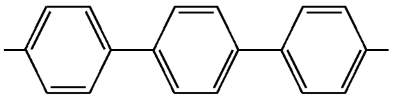

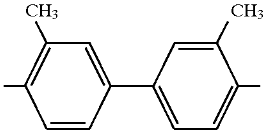

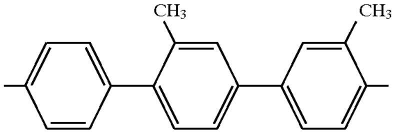

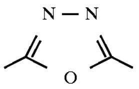

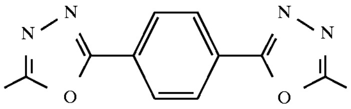

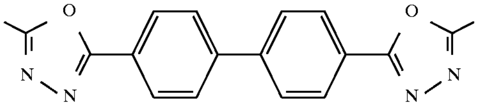

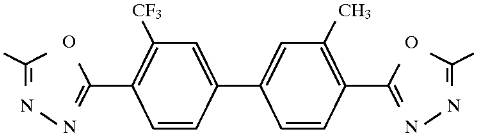

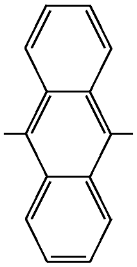

where:

M, L are H, Br, Cl, F, CN, $NO_2$ or $CF_3$, or a straight-chain or branched alkyl group having from 1 to 22 carbon atoms, where one or more $—CH_2—$ groups can be replaced by —O—, —CO—O—, —O—CO— and one or more hydrogen atoms can be replaced by F;

m+n is 0 or 1 with the following polymers being excepted:

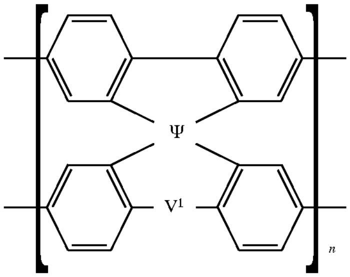

wherein:

Ψ=Si $V^1$=CO and

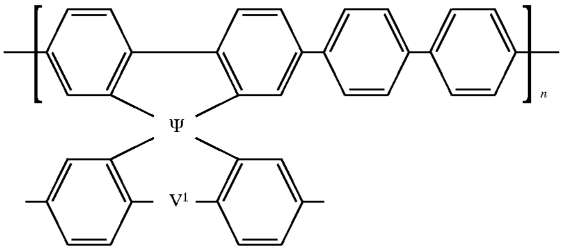

wherein:

Ψ=Si $V^1$=CO.

15. A polymer as claimed in claim 1, wherein said polymer is a copolymer.

16. A polymer as claimed in claim 2, wherein said polymer is a copolymer.

17. A method of using the polymer as claimed in claim 1 as an electroluminescence material comprising the step of applying an electric field to said polymer causing the polymer to emit light.

18. An electroluminescence material comprising a polymer as claimed in claim 1.

19. A process for producing an electroluminescence material which comprises the step of applying a polymer as claimed in claim 1 to a substrate material to form a layer.

20. An electroluminescence device comprising one or more active layers, wherein at least one of these active layers comprises a polymer as claimed in claim 1 as electroluminescence material.

* * * * *